United States Patent [19]

Chavers et al.

[11] Patent Number: 4,502,745

[45] Date of Patent: Mar. 5, 1985

[54] PROGRESSIVELY-INCREASING CLAMPING FORCE LEAD AND LEAD-SUBSTRATE ASSEMBLY

[75] Inventors: Richard A. Chavers; Oland J. Duff, both of Atkinson, N.H.

[73] Assignee: AT&T Technologies, Inc., New York, N.Y.

[21] Appl. No.: 562,510

[22] Filed: Dec. 19, 1983

[51] Int. Cl.³ .............................................. H01R 4/02
[52] U.S. Cl. .............................. 339/17 C; 339/275 R
[58] Field of Search .............. 339/17 C, 17 LC, 17 L, 339/75 MP, 75 M, 75 CF, 275 R, 275 T, 275 B

[56] References Cited

U.S. PATENT DOCUMENTS

| | | | |
|---|---|---|---|
| 4,120,558 | 10/1978 | Seidler | 339/275 T |
| 4,150,863 | 4/1979 | Krafthefer et al. | 339/17 LC |
| 4,203,648 | 5/1980 | Seidler | 339/275 T |
| 4,221,448 | 9/1980 | Logerot et al. | 339/75 MP |
| 4,302,067 | 11/1981 | Monson et al. | 339/275 R |
| 4,345,814 | 8/1982 | Gutbier et al. | 339/275 R |
| 4,348,071 | 9/1982 | Hsieh | 339/75 MP |
| 4,357,069 | 11/1982 | Milora | 339/275 R |

Primary Examiner—Eugene F. Desmond
Attorney, Agent, or Firm—D. D. Bosben

[57] ABSTRACT

A progressively-increasing clamping force lead (10) includes a resilient contact finger (22) having an outer arcuate loop portion (26) and a locking tab (34) having a camming surface (70) projecting at an angle from an outer end of the arcuate loop portion toward a planar surface (56) of a clamping finger (20). In the assembling of the lead (10) to the substrate circuit device (16), as the locking tab (34) engages and rides up an adjacent edge (64) of the substrate circuit device, the locking tab causes progresive flexing of an inner connecting portion (36) of the contact finger (22) and progressive coiling of the arcuate loop portion (26) of the contact finger to cause the arcuate loop portion to engage a contact pad (14) with a progressively-increasing force. Subsequently, the arcuate loop portion (26) and the locking tab (34) seat firmly on the contact pad (14) to retain the lead (10) securely on the substrate circuit device (16). The lead (10) then may be soldered to the contact pad (14).

12 Claims, 5 Drawing Figures

U.S. Patent  Mar. 5, 1985  4,502,745
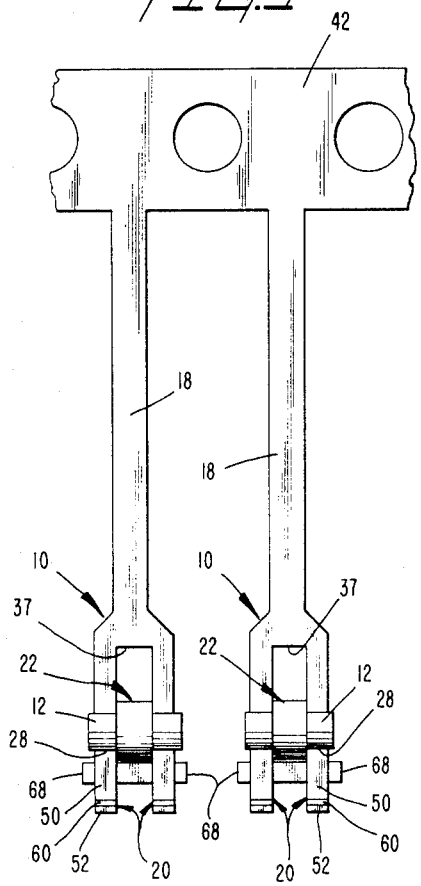
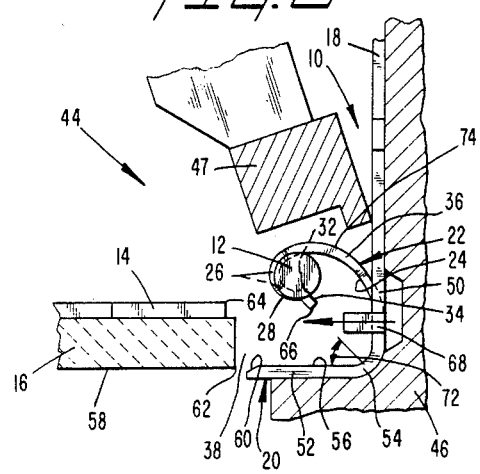
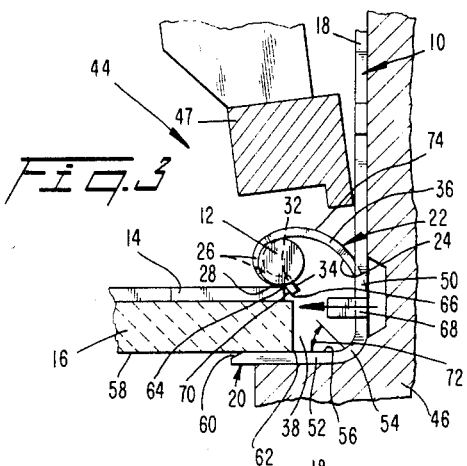
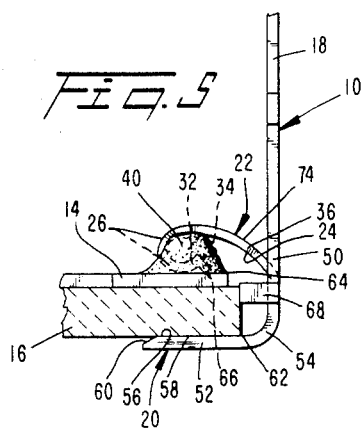
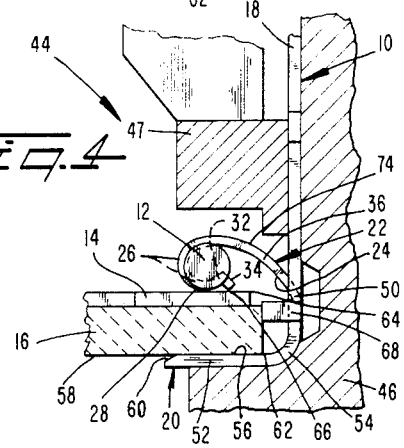

PROGRESSIVELY-INCREASING CLAMPING FORCE LEAD AND LEAD-SUBSTRATE ASSEMBLY

TECHNICAL FIELD

This invention relates to a progressively-increasing clamping force lead and a lead-substrate assembly, and more particularly to a progressively-increasing clamping force lead of a type in which the clamping force with which the lead is retained on a substrate progressively increases as the lead is assembled to the substrate to produce a lead-substrate assembly.

BACKGROUND OF THE INVENTION

A solder bearing lead is known in which the lead includes opposed resilient clamping fingers projecting from one end of an elongated stem, wherein a central finger defines an electrical contact and a pair of spaced outer fingers have an inverted curved configuration. The clamping fingers include opposed inner surfaces which define a gap for the reception of a rigid substrate circuit device, such that the inner surface on the electrical contact clamping finger engages a contact pad on the substrate circuit device. On an outer opposite surface of the contact clamping finger, the contact clamping finger carries a cylindrical solder preform as a result of the contact clamping finger having been wrapped about the solder preform in a circular configuration. The solder preform, upon being temporarily subjected to heat in a soldering operation, initially melts the flows over opposite sides of the contact finger on the contact pad, and then resolidifies to bond the lead to the contact pad. Solder-bearing leads of this type are shown in U.S. Pat. Nos. 4,120,558 and 4,203,648 to J. Seidler, and U.S. Pat. No. 4,345,814 to E. A. Gutbier et al.

U.S. Pat. No. 4,302,067 to R. R. Monson et al. discloses a solder-bearing lead in which portions of a solder preform carried on an outer surface of a lead contact finger directly engage a contact pad on a substrate circuit device to facilitate flow of molten solder from the preform over the contact pad in a soldering operation. In this regard, in the Monson et al. patent the contact finger is crimped about the center of the solder preform in a circular configuration so as to deform the preform into an hourglass or "bowtie" configuration such that opposite ends of the preform engage the contact pad when the lead is mounted on the contact pad.

Copending patent application Ser. No. 402,631, filed on July 28, 1982, in the name of R. D. Mackay and entitled "Solder-Bearing Lead Having a Solder Preform Engageable Directly With a Contact Pad," and assigned to the same assignee as the subject application, also discloses a solder-bearing lead in which a cylindrical solder preform directly engages a contact pad on a substrate circuit device to facilitate flow of molten solder from the preform over the contact pad in a soldering operation. In this regard, in the R. D. Mackay application an inner surface of a contact finger of a lead is wrapped about the solder preform in a circular configuration and in a direction such that a surface portion of the cylindrical preform projects from the contact finger for direct engagement with the contact pad when the lead is mounted on the contact pad. When the lead is temporarily subjected to heat in a soldering operation, the solder preform melts and flows directly over the contact pad and then resolidifies to form a soldered connection having an outer end portion of the contact finger embedded therein.

Further, copending patent application Ser. No. 402,684, filed on July 28, 1982, in the name of P. J. Ouellette and entitled "Lead Having a Solder Preform and Preform Carrying Finger Engageable Directly With a Contact Pad", and assigned to the same assignee as the subject application, discloses a solder bearing lead similar to that disclosed in the Mackay application. However, in the Ouellette application the contact clamping finger which carries the solder preform also directly engages the contact pad to which the lead is to be soldered, to produce an electrical and mechanical connection between the lead and the contact pad.

Solder-bearing leads as above described normally are fabricated in strip form in a progressive punch-and-die from a strip of phosphorous bronze base metal which has been provided with thin tin coatings on opposite sides thereof, to facilitate the subsequent making of electrical connections to the leads. During the lead fabrication process in the progressive punch-and-die, a continuous solder wire is attached to the contact fingers of the leads and subsequently clipped between the leads to form the solder preforms on the leads.

The substrate circuit devices normally are fabricated by forming a plurality of thin film circuits on one side of a ceramic substrate. The thin film circuits then are separated by laser-scribing lines in the circuit side of the ceramic substrate and snapping the substrate along the scribed lines to produce the individual substrate circuit devices.

The leads may be mounted on substrate circuit devices utilizing automatic apparatus as disclosed in U.S. Pat. No. 4,177,554 to E. E. Deveres et al., to form lead-substrate circuit device assemblies. The leads then are soldered to the substrate circuit devices as above described, in a mass soldering operation in which the lead-substrate circuit device assemblies are mounted in carriers in inclined, closely adjacent relationship. Subsequently, the stems of the leads, which are formed integrally with an elongated continuous support rail during the lead fabrication process, are clipped from the rail to produce operable electrical devices.

Each of the resultant electrical devices then is electrically tested to determine the integrity of the electronic circuitry and of the soldered connections between the leads and their respective contact pads on the substrate circuit devices. In this regard, it has been found that in a number of instances in which failures occur, the failures are due to metal shavings having become engaged across and shorting out adjacent ones of the contact pads or associated thin film circuits on the substrate circuit device. In other instances, the failures have been found to be of a mechanical type. For example, the failure may be the result of the substrate circuit device having caused one of the contact clamping fingers to be "rolled back" away from its respective contact pad as the leads are mounted on the device. In other instances, it has been found that the solder-bearing lead has fallen off the substrate circuit device as a result of the "roll back" of the contact finger, or as a result of the substrate-receiving gap of the lead having been formed oversize.

The above-mentioned electrical failures due to metal shavings shorting out contact pads or other circuitry are attributed primarily to noncircuit sides of the ceramic substrates of the substrate circuit devices having smooth sharp lower edges formed thereon as a result of the above-mentioned substrate-snapping operation. In this connection, the sharp edges shave off portions of the tin coatings and base metal of the curved outer clamping fingers of the leads across the width of the fingers as the leads are forced onto the substrate circuit devices. Then, during subsequent handling, including soldering of the leads to the substrate circuit devices in the mass soldering operation as above described, the metal shavings apparently fall onto, or otherwise migrate to, circuit sides of the substrate circuit devices to produce shorts therein. Upper edges of the ceramic substrates formed by the above-mentioned laser-scribing also tend to shave metal from the circular portions of the contact fingers of the leads; but to a lesser degree. The shaving of metal from the leads is further aggravated when the substrate-receiving gaps of the leads are formed undersize, thus requiring an abnormally high insertion force to assemble the leads to a substrate circuit device.

Similarly, the "roll back" of the lead contact fingers is attributed to the need to force the leads on the substrate circuit devices in order to assure firm mechanical engagement of the lead contact fingers with their respective contact pads. More specifically, during insertion of one of the substrate circuit devices into the gaps defined by the respective lead fingers, an upper edge of the substrate circuit device engages the circular clamping portions of the contact fingers at an angle to the horizontal in excess of 45°. As a result, a major component of the insertion force required in the assembling operation is directed horizontally against the lead contact fingers, rather than vertically so as to cause flexing of the contact fingers with respect to the opposed curved outer clamping fingers for the reception of the substrate circuit device. Accordingly, the lead contact fingers tend to buckle and be "rolled back" by the substrate circuit device as noted above. As in the case of the forming of metal shavings as discussed above, this "roll back" of the lead contact fingers is further aggravated when the substrate-receiving gaps of the leads have been formed undersize.

Proposed solutions to reducing the above-described incidence of electrical and/or mechanical failures are disclosed in the copending patent application Ser. No. 437,587 of R. D. Mackay entitled "Low-Insertion Force Method of Assembling a Lead and a Substrate," and the copending patent application Ser. No. 437,723 of P. J. Ouellette et al. entitled "Low-Insertion Force Solder-Bearing Lead and Method of Assembling," both filed Oct. 29, 1982, and assigned to the same assignee as the subject application. In this regard, in the R. D. Mackay application, compressive forces are applied to portions of the lead in opposite directions during an assembling operation so as to flex the lead and force the substrate clamping finger into firm engagement with respective opposite sides of the substrate. In the P. J. Ouellette et al. application, the lead outer clamping fingers are of planar construction and extend parallel to the substrate during an assembling operation. Further, the solder-bearing central clamping finger and solder preform thereon have substrate-engaging surfaces which extend at an angle of no more than 45° to the planar outer clamping fingers, such that the major portion of an insertion force for assembling the lead and substrate is applied to the central clamping finger and the solder preform in a direction away from the planar outer clamping fingers. In this regard, a purpose of this invention is to provide an alternate solution for reducing the incidence of electrical and/or mechanical failures as a result of a lead-substrate assembling operation.

SUMMARY OF THE INVENTION

In general, a progressively-increasing clamping force lead comprises first and second resilient clamping fingers projecting from a stem portion and having respective first and second substrate clamping portions extending in opposed relationship to define a gap for the reception of a substrate. The first substrate clamping portion includes an arcuate loop portion which projects toward an inner surface of the second substrate clamping portion. A projecting locking tab at an outer end of the arcuate loop portion has a camming surface which extends from the outer end of the arcuate loop portion at an angle toward the inner surface of the second substrate clamping portion.

More specifically, a solder preform may be mounted on the first clamping finger with the arcuate loop portion of the first substrate clamping portion wrapped about the preform in clamping relationship. When the lead is mounted on the substrate, the arcuate loop portion of the first substrate clamping portion and the locking tap at the outer end of the arcuate loop portion may both firmly engage a contact pad on a surface portion of the substrate. The inner surface of the second substrate clamping portion may be of planar construction for engaging an opposed planar surface of the substrate in mating relationship. Further, the arcuate loop portion of the first substrate clamping portion and the planar inner surface of the second substrate clamping portion may be spaced apart to receive the substrate into engagement with the camming surface of the locking tab with an initial essentially zero-insertion force. The camming surface on the locking tab also may extend toward the planar inner surface of the second substrate clamping portion at an angle of not more than 45°.

BRIEF DESCRIPTION OF THE DRAWINGS

FIG. 1 is an elevational view of a portion of a strip of leads in accordance with the invention;

FIG. 2 is a partial side view of a lead in accordance with the invention, illustrating a first stage of a lead-substrate assembling operation;

FIGS. 3 and 4 are views similar to FIG. 2, showing the lead thereof in subsequent stages of the lead-substrate assembling operation; and FIG. 5 is a partial side view of the lead of FIGS. 2–4 after the lead has been assembled and soldered to a substrate circuit device.

DETAILED DESCRIPTION

Referring to FIGS. 1–5, the invention as disclosed in these figures is directed to a solder-bearing lead 10 of a type as disclosed in the copending application Ser. No. 402,684, filed July 28, 1982, in the name of P. J. Ouellette, and the copending application Ser. No. 437,723, filed Oct. 29, 1982, in the names of P. J. Ouellette et al., both assigned to the same assignee as the subject application, and the disclosures of which, to the extent not inconsistent herewith, are hereby incorporated by reference. In this connection, each lead 10 carries a mechanically clamped solder preform 12 (FIGS. 1–4) for bonding the lead to a respective contact pad 14 (one shown in FIGS. 2–5) on a rigid substrate circuit device 16. More specifically, each lead 10 includes an elongated stem 18, a pair of spaced outer resilient clamping fibers 20 and an opposed central resilient clamping finger 22. The solder preform 12 is carried on an inner surface 24 of the central resilient clamping finger 22, which defines an electrical contact having opposite end portions of the preform projecting in a cantilevered fashion from opposite sides of the contact finger.

The central contact finger 22 of each lead 10 is wrapped about the solder preform 12 so that an outer end portion 26 of the contact finger, and surface portions 28 (FIG. 2) of the solder preform, are in opposed spaced relationship to the pair of outer resilient clamping fingers 20. In this regard, the outer end portion 26 of the contact finger 22 is in the form of an arcuate partial loop which projects toward the contact fingers 20 and which terminates in an outer end 32. Further, in accordance with this invention the outer end 32 of the arcuate loop portion 26 has an integral locking tab 34 which projects from the outer end toward the outer clamping fingers 20. The arcuate loop portion 26 is connected to the stem 18 by an arcuate inner resilient portion 36 of the central contact finger 22. The central contact finger 22 is formed from a central portion 37 of the stem, as is best shown in FIG. 1, with the arcuate inner resilient portion 36 extending upward from a junction with the stem 18 as shown in FIGS. 2-5.

The contact finger arcuate loop portion 26, solder preform surface portions 28, outer resilient clamping fingers 20 and locking tab 34 define a gap 38 (FIG. 2) in which the substrate circuit device 16 is receivable with a tight-fit for mounting the lead on the substrate circuit device. The arcuate loop portion 26 of the contact finger 22, the preform surface portions 28 and the locking tab 34 also directly engage the contact pad 14 on the substrate circuit device 16, as shown in FIG. 4, when the lead 10 is assembled with the device. Accordingly, when the solder preform 12 reaches a molten state in a soldering operation, as soon as the surface tension of the molten solder is reduced sufficiently by associated flux to permit flow of the solder, the preform flows directly over the surface of the contact pad 14 to form a soldered connection 40 (FIG. 5) between the contact finger 22 of the lead 10 and the contact pad. At the same time, the arcuate loop portion 26 and the locking tab 34 of the contact finger 22 firmly engage the contact pad 14 prior to becoming embedded in the resolidified solder, as shown in FIG. 5, to establish a strong and reliable electrical and mechanical connection with the contact pad.

The stems 18 and the resilient clamping fingers 20 and 22 of the leads 10 are formed of a base metal, such as phosphorous bronze, which is not readily wetted by solder when oxidized as a result of exposure to the atmosphere, and which is coated on opposite surfaces thereof with thin coatings (not shown) of a metal which is readily wetted by solder, such as tin. The tin coatings (not shown) facilitate the making of electrical soldered connections (such as the soldered connections 40) to the leads 10. The stems 18 of the leads 10 also are formed integrally with an elongated continuous apertured support rail 42 (FIG. 1) which subsequently is clipped from the stems after the leads 10 have been mounted on the substrate circuit device 16 and soldered to their respective contact pads 14 as shown in FIG. 5. The stems 18 of the leads 10 then subsequently are inserted through apertures in circuit pads on a printed circuit board (not shown) and soldered to the circuit pads in a known manner.

As is illustrated in FIGS. 2, 3 and 4, a plurality of the leads 10 may be assembled to opposite sides (only one side shown) of the substrate circuit device 16 simultaneously, utilizing apparatus as disclosed in U.S. Pat. No. 4,177,554, issued Dec. 11, 1979, to E. E. Deveres et al. More specifically, the substrate circuit device 16 is fed into an assembling station 44 and supported therein by a vacuum feed mechanism (not shown). A plurality of the leads 10 are fed in strip form into each side of the assembling station 44 and onto a seat portion of a reciprocable pusher slide 46 located adjacent the respective side of the assembling station. Spring-loaded clamping bars 47 then are moved into engagement with the leads 10 on each pusher slide 46, as shown in FIG. 2, to hold the leads against the seat portion of the slide. As the pusher slides 46 then are advanced toward the substrate circuit device 16, sets of the leads 10 are severed from their respective strips by a cutting mechanism (not shown) and the sets of leads are assembled to the respective sides of the device as shown in FIG. 3.

As is disclosed in the above-mentioned copending patent application Ser. No. 437,723 of P. J. Ouellette et al., each of the resilient outer clamping fingers 20 of each lead 10 includes a first portion defined by a straight line extension 50 of the lead stem 18, and a substrate clamping portion 52 extending essentially perpendicularly with respect to the extension of the stem. The substrate clamping portion 52 is connected to the straight line stem extension 50 by an arcuate stem extension portion 54 of a preselected radius. Each of the substrate clamping portions 52 is of planar construction and includes an inner planar surface 56 which engages an opposed planar surface 58 of the substrate circuit device 16 in parallel mating relationship as the device is being received in the gap 38 defined by the outer clamping fingers 20 and the central contact finger 22. An outer end of each substrate clamping portion 52 also includes a chamfered surface 60 for guiding a lower corner edge 62 of the substrate circuit device 16 onto the planar inner surface 56 of the substrate clamping portion 52 in an assembling operation. Thereafter, the lower edge 62 of the substrate circuit device 16 moves smoothly over the inner planar surfaces 56 without any significant tendency to scrape or shave the above-mentioned tin coatings (not shown) and base metal from the inner planar surfaces, so as to produce metal shavings which could subsequently cause electrical shorts between adjacent ones of the contact pads 14 and/or associated film circuitry on the substrate circuit devices 16.

Referring to FIGS. 2 and 3, in accordance with this invention the arcuate loop portion 26 of the central contact finger 22 and the planar inner surfaces 56 of the outer clamping fingers 20 may be spaced apart a distance equal to or slightly larger than the thickness of the substrate circuit device 16. Thus, the substrate circuit device 16 can initially be received into the gap 38 with substantially a zero-insertion force until the substrate circuit device engages the locking tab 34 on the central contact finger 22. As a result, an upper edge 64 of the substrate circuit device 16 has no significant tendency to shave off the above-mentioned tin coatings (not shown) and base metal from the arcuate loop portion 26 so as to produce metal shavings which could subsequently cause electrical shorts between adjacent ones of the contact pads 14 and/or associated film circuitry on the substrate circuit devices 16. At the same time, any tendency for the upper edge 64 of the substrate circuit device 16 to "roll back" the central contact finger 22 as a result of the upper edge exerting an excessive horizontal force component against the arcuate loop portion 26 of the central contact finger, is essentially eliminated.

As viewed in FIG. 3, as the substrate circuit device 16 is received further into the substrate-receiving gap 38 the upper edge 64 of the substrate circuit device 16 moves the locking tab 34 to the right, to cause the inner resilient portion 36 of the central contact finger 22 to be flexed or bowed upward to the right. At the same time, the rightward movement of the locking tab 34 causes the arcuate loop portion 26 of the contact finger 22 to coil or rotate counter-clockwise as viewed in FIG. 3, to exert a progressively-increasing clamping force on the contact pad 14. The locking tab 34 subsequently begins to ride up and over the upper edge 64 of the substrate circuit device 16, with the coiling of the arcuate loop portion 26 into clamping engagement with the contact pad 14 with a progressively-increasing force continuing until a lower edge 66 of the locking tab engages the top of the contact pad as viewed in FIG. 3. Continued insertion of the substrate circuit device 16 into the substrate-receiving gap 38 until the substrate circuit device engages stop tabs 68 on the lead stem extensions 50, then causes the arcuate loop portion 26 and the lower edge 66 of the locking tab 34 to ride over the surface of the contact pad 14 to a position as shown in FIG. 4.

To reduce the insertion force required to complete the assembly of the substrate circuit device 16 into the gap 38 of the lead 10 as shown in FIGS. 3 and 4, and also reduce the formation of short-producing metal shavings from the locking tab 34 of the lead, in accordance with this invention the locking tab includes planar camming surface 70. By way of illustration, the planar camming surface 70 may extend relative to the inner planar surfaces 56 of the outer finger substrate clamping portions 52 at an inclined angle 72 of not more than 45°, as shown in FIGS. 2 and 3. Accordingly, as is illustrated in FIG. 3, as the upper edge 64 of the substrate circuit device 16 engages the inclined camming surface 70 during an assembling operation, relative movement between the substrate circuit device 16 and the inclined camming surface 70 is facilitated, and the tendency for the upper edge 64 of the substrate circuit device to shave metal from the inclined camming surface, is reduced.

Referring to FIG. 5, as the solder of the solder preform 12 melts during the above-mentioned soldering operation, the arcuate loop portion 26 assumes a stabilized flexed condition and tends to flatten slightly from an initial circular configuration into a quasi-elliptical configuration in which the arcuate loop portion and the lower edge 66 of the locking tab 34 seat firmly against the contact pad 14. The locking tab 34 then precludes the lead 10 from retrograde movement off of the substrate circuit device 16. When the melted solder preform 12 then solidifies to form the soldered connection 40, as shown in FIG. 5, the result is a connection of high reliability from both the electrical and mechanical standpoints.

To preclude the flow of molten solder from the solder preform 12 along the central contact finger 22 to the stem 18, solder-confining stops (not shown) may be formed from oxidized base metal portions on the inner surface 24 and on an outer surface 74 of the contact finger, by removing portions of the above-mentioned solder-wettable metal coatings (not shown) during fabrication of the leads, as disclosed in the U.S. Pat. No. 4,345,814 to E. A. Gutbier et al. Similar oxidized base metal solder-confining stops (not shown) may be formed on the outer clamping fingers 20 and/or the stem 18, as desired.

The solder preforms 12 may each consist of an essentially cylindrical piece of a relatively malleable solder wire, such as a 60–40 tin-lead alloy. Preferably, however, the solder preforms 12 are of a flux-bearing type suitable for use in a progressive punch-and-die, such as the number 2879 or number 4147 rosin core solder available from the Alpha Metals Company of Newark, N. J., so as to eliminate or reduce the amount of supplemental spray fluxing required in the soldering of the leads 10.

While the lead 10 shown in FIGS. 1–5 is shown as having the solder preform 12 clamped in the arcuate loop portion 26 of the central contact finger 20, it is considered within the purview of the invention to omit the solder preform from the lead. Thus, when one of the leads 10 of that type is assembled onto the substrate circuit device 16 as illustrated in FIGS. 2–5, since there is no solder within the initially circular arcuate open loop portion 26, the arcuate open loop portion begins to flatten toward a quasi-elliptical shape as shown in FIG. 5 as soon as the upper edge 64 of the substrate circuit device 16 engages the locking tab 34. As the assembling operation continues, the arcuate open loop portion 26 assumes a quasi-elliptical stabilized compressed configuration, with the arcuate open loop portion 26 and the lower edge 66 of the locking tab 34 firmly engaging the contact pad 14, as shown in FIG. 5. The arcuate open loop portion 26 and the locking tab 34 then may be soldered to the contact pad 14 in a reflow soldering operation, as above-described, utilizing a suitable soldering paste (not shown) which is applied to the contact pad either prior to or subsequent to assembly of the lead to the contact pad.

In summary, a new and improved progressively-increasing clamping force lead, such as the lead 10, has been disclosed. In this connection, the arcuate loop portion 26 and the locking tab 34, in combination with the planar surfaces 56 of the substrate clamping portions 52 of the outer resilient clamping fingers 20, enables initial assembly of the lead to the substrate circuit device 16 as shown in FIG. 3 to be accomplished with essentially no initial insertion force. As a result, the upper edge 64 of the substrate circuit device has no significant tendency to shave metal from the arcuate loop portion 26 to form electrical short-producing shavings, or to produce "roll back" of the central contact finger 22. This lead construction, including the inclined camming surface 70 on the locking tab 34, also enables continued assembly of the lead 10 to the substrate circuit device 16, as shown in FIG. 4, to be accomplished with a low-insertion force. This reduces the tendency for the lower edge 62 of the substrate circuit device 16 to shave metal from the substrate clamping portions 52 to form electrical short-producing metal shavings, and also reduces the tendency for the upper edge 64 of the substrate circuit device to shave metal from the inclined camming surface 70. At the same time, the locking tab 34 causes the arcuate loop portion 26 to be coiled against the contact pad 14 with a progressively-increasing clamping force. Ultimately, both the arcuate loop portion 26 and the locking tab 34 engage the contact pad 14, as shown in FIG. 4, to retain the lead 10 securely on the substrate circuit device 16. The lead 10 then may be reflow-soldered to the contact pad 14, as shown in FIG. 5.

What is claimed is:

1. A progressively-increasing clamping force lead, which comprises:
   a stem portion;
   first and second resilient clamping fingers projecting from the stem portion and having respective first and second substrate clamping portions extending in opposed relationship to define a gap for the reception of a substrate therebetween, the first substrate clamping portion including an arcuate loop portion which projects toward an inner surface of the second substrate clamping portion; and
   a projecting locking tab at an outer end of the arcuate loop portion of the first substrate clamping portion, the locking tab having a camming surface extending at an angle from the outer end of the arcuate loop portion toward the inner surface of the second substrate clamping portion.

2. A progressively-increasing clamping force lead as recited in claim 1, in which:
   the inner surface of the second substrate clamping portion is of planar construction for engaging an opposed planar surface of the substrate in parallel mating relationship when the substrate is inserted into the gap between the first and second substrate clamping portions, with the arcuate loop portion of the first substrate clamping portion and the planar inner surface of the second substrate clamping portion being spaced apart to receive the substrate therebetween into engagement with the camming surface of the locking tab with an essentially zero-insertion force.

3. A progressively-increasing clamping force lead as recited in claim 1, in which:
   the camming surface on the locking tab extends toward the inner surface of the second substrate clamping portion at an angle of not more than 45°.

4. A progressively-increasing clamping force lead as recited in claim 1, which further comprises:
   a solder preform mounted on the first substrate clamping portion with the arcuate loop portion of the first substrate clamping portion being wrapped about the solder preform in clamping relationship.

5. A progressively-increasing clamping force lead as recited in claim 4, in which:
   a part of the arcuate loop portion of the substrate clamping portion of the first clamping finger is embedded in the solder preform such that surface portions of the preform on opposite sides of the finger can directly engage a contact pad on the substrate when the substrate is received between first and second substrate clamping portions, with the locking tab projecting externally of the solder preform.

6. A progressively-increasing clamping force lead as recited in claim 1, in which:
   the first clamping finger is formed from a section of the stem portion of the lead.

7. A progressively-increasing clamping force lead as recited in claim 3, in which:
   the first clamping finger is a central finger formed from a central section of the stem portion of the lead; and
   the second clamping finger is one of two side fingers projecting from opposite sides of the stem portion of the lead.

8. A progressively-increasing clamping force lead, which comprises:
   a stem portion;
   first and second resilient clamping fingers projecting from the stem portion and having respective first and second substrate clamping portions extending in opposed relationship to define a gap for the reception of a substrate therebetween, the first substrate clamping portion including an arcuate loop portion which projects toward the second substrate clamping portion and the second substrate portion having an inner planar surface for engaging an opposed surface of the substrate in mating relationship when the substrate is inserted in the gap between the first and second substrate clamping portion; and
   a locking tab projecting from an outer end of the arcuate loop portion of the first substrate clamping portion, the locking tab including an inclined camming surface extending toward the inner planar surface of the second substrate clamping portion at an angle of not more than 45°, with the arcuate loop portion and the inner planar surface being spaced apart to receive the substrate therebetween into engagement with the camming surface of the locking tab with an essentially zero-insertion force.

9. A lead-substrate assembly, which comprises:
   a lead having first and second resilient clamping fingers projecting from a stem portion of the lead, the clamping fingers having respective first and second substrate clamping portions extending in opposed spaced relationship; and
   a substrate disposed between the opposed substrate clamping portions and having a surface portion, the first substrate clamping portion including an arcuate loop portion which projects into firm engagement with the surface portion of the substrate, and the arcuate loop portion having a locking tab projecting at an angle from an outer end of the arcuate loop portion into firm engagement with the surface portion of the substrate.

10. A lead-substrate assembly as recited in claim 9, in which:
    the locking tab has a sharp edge firmly engaged with the surface portion of the substrate.

11. A lead-substrate assembly as recited in claim 9, in which:
    the second substrate clamping portion has an inner planar surface engaged with an opposed planar surface of the substrate in parallel mating relationship.

12. A lead-substrate assembly as recited in claim 11, which further comprises:
    a solder mass bonded to a contact pad on the surface portion of the substrate, with a substrate-engaging portion of the arcuate loop portion and the locking tab embedded in the solder mass.

* * * * *